United States Patent
Ikarashi

(10) Patent No.: US 10,511,330 B2
(45) Date of Patent: Dec. 17, 2019

(54) DECODING APPARATUS, DECODING METHOD AND PROGRAM

(71) Applicant: NIPPON TELEGRAPH AND TELEPHONE CORPORATION, Chiyoda-ku (JP)

(72) Inventor: Dai Ikarashi, Musashino (JP)

(73) Assignee: NIPPON TELEGRAPH AND TELEPHONE CORPORATION, Chiyoda-ku (JP)

( * ) Notice: Subject to any disclaimer, the term of this patent is extended or adjusted under 35 U.S.C. 154(b) by 102 days.

(21) Appl. No.: 15/572,050

(22) PCT Filed: May 11, 2016

(86) PCT No.: PCT/JP2016/063996
§ 371 (c)(1),
(2) Date: Nov. 6, 2017

(87) PCT Pub. No.: WO2016/181992
PCT Pub. Date: Nov. 17, 2016

(65) Prior Publication Data
US 2018/0138925 A1 May 17, 2018

(30) Foreign Application Priority Data
May 12, 2015 (JP) ................................. 2015-097276

(51) Int. Cl.
*H03M 13/15* (2006.01)
*G06F 11/10* (2006.01)
(Continued)

(52) U.S. Cl.
CPC .......... *H03M 13/151* (2013.01); *G06F 11/10* (2013.01); *G11B 20/18* (2013.01); *H03M 13/158* (2013.01);
(Continued)

(58) Field of Classification Search
CPC .......... H03M 13/151; H03M 13/6561; H03M 13/15; G06F 11/10; G11B 20/18
See application file for complete search history.

(56) References Cited

U.S. PATENT DOCUMENTS

| 2002/0191784 A1* | 12/2002 | Yup | ........................ | H04L 9/0631 380/37 |
| 2011/0142232 A1* | 6/2011 | Jeong | .................... | H04L 9/0662 380/42 |

(Continued)

OTHER PUBLICATIONS

Bernard Sklar, "Digital Communications: Foundations and Application," Pearson Education, Inc., $2^{nd}$ Edition, 2006, Channel Coding: Part 3, Chapter 8 (English translation with Japanese edition by Pearson Education Japan, 2001), 37 pages.

(Continued)

*Primary Examiner* — Thien Nguyen
(74) *Attorney, Agent, or Firm* — Oblon, McClelland, Maier & Neustadt, L.L.P.

(57) ABSTRACT

To reduce the processing amount of a field multiplication. a denotes a k-th order vector whose elements are $a_0, \ldots, a_{k-1}$ ($a_0, \ldots, a_{k-1} \in GF(x^q)$). A denotes an n-by-k matrix formed by vertically connecting a identity matrix and a Vandermonde matrix. b denotes an n-th order vector obtained by multiplying the vector a and the matrix A whose elements are $b_0, \ldots, b_{n-1}$ ($b_0, \ldots, b_{n-1} \in GF(x^q)$). A vector conversion part 11 generates a $\phi$-th order vector b' using $\phi$ elements $b_{p0}, \ldots, b_{p\phi-1}$ of the vector b. An inverse matrix generation part 12 generates a $\phi$-by-$\phi$ inverse matrix $A'^{-1}$. A plaintext computation part 13 computes elements $a_{e0}, \ldots, a_{e\phi-1}$ of the vector a by multiplying the vector b' and the inverse matrix $A'^{-1}$.

8 Claims, 2 Drawing Sheets

(51) Int. Cl.
*G11B 20/18* (2006.01)
*H03M 13/00* (2006.01)
*H03M 13/37* (2006.01)

(52) U.S. Cl.
CPC ..... *H03M 13/1515* (2013.01); *H03M 13/373* (2013.01); *H03M 13/616* (2013.01); *H03M 13/6502* (2013.01); *H03M 13/6561* (2013.01)

(56) References Cited

U.S. PATENT DOCUMENTS

| | | | |
|---|---|---|---|
| 2012/0237020 A1* | 9/2012 | Pruss | H04L 9/0631 380/28 |
| 2015/0270967 A1* | 9/2015 | Susella | H04L 9/3093 380/30 |
| 2018/0107629 A1* | 4/2018 | Ikarashi | G06F 17/16 |
| 2018/0123780 A1* | 5/2018 | Ikarashi | G09C 1/00 |
| 2018/0138925 A1* | 5/2018 | Ikarashi | H03M 13/15 |

OTHER PUBLICATIONS

Hugo Krawczyk, "Secret Sharing Made Short," D.R. Stinson (Ed.): Advances in Cryptology, CRYPTO 1993, pp. 136-146, 1994.
International Search Report dated Jun. 14, 2016 in PCT/JP2016/063996 filed May 11, 2016.

\* cited by examiner

DECODING APPARATUS, DECODING METHOD AND PROGRAM

TECHNICAL FIELD

The present invention relates to an encoding technique. In particular, it relates to a technique of efficiently performing a decoding process.

BACKGROUND ART

A conventional error correcting coding technique is Reed-Solomon codes. Reed-Solomon Codes are described in the non-patent literature 1, for example.

An encoding process for an error correcting code is a process of determining an output vector b by multiplying an input vector a in the form of a plaintext by a linear transformation (i.e., a matrix) A, which can be expressed by the formula (1). More specifically, the i-th row of the matrix A indicates coefficients by which the elements of the input vector a are multiplied in order to produce the i-th element $b_i$ of the output vector b.

$$b = Aa \qquad (1)$$

A decoding process for the error correcting code can also be regarded as a linear transformation. Provided that A' and b' are a matrix and a vector obtained by extracting only the rows corresponding to k elements of the matrix A and the vector b used for the decoding, respectively, the decoding process can be expressed by the formula (2).

$$b' = A'a \qquad (2)$$

Thus, if the matrix A has an inverse matrix, the vector a can be decoded according to the formula (3).

$$a = A'^{-1} b' \qquad (3)$$

In encoding for the error correcting code, it is assumed that the input vector a is a k-th order vector expressed by the formula (4), where k denotes an integer equal to or greater than 2.

$$a = \begin{pmatrix} a_0 \\ \vdots \\ a_{k-1} \end{pmatrix} \qquad (4)$$

It is assumed that the output vector b is an n-th order vector expressed by the formula (5), where n denotes an integer equal to or greater than 2, and $n \geq 2k-1$.

$$b = \begin{pmatrix} b_0 \\ \vdots \\ b_{n-1} \end{pmatrix} \qquad (5)$$

The matrix A is a matrix formed by vertically connecting a k-by-k identity matrix and an m-by-k Vandermonde matrix, where m=n−k. The Vandermonde matrix is a matrix having a special configuration in which elements of rows or columns are the terms of a geometric progression sequentially arranged.

$$A_{ij} = \begin{cases} 1 & \text{if } i = j \\ 0 & \text{if } i \neq j \text{ and } i < k \\ x^{(i-k)j} & \text{if } i \geq k \end{cases} \qquad (6)$$

where
$i \in \{0, \ldots, n-1\}, j \in \{0, \ldots, k-1\}$

In short, the matrix A is an n-by-k matrix expressed by the formula (7).

$$\begin{pmatrix} 1 & 0 & 0 & \cdots & 0 \\ 0 & 1 & 0 & \cdots & 0 \\ 0 & 0 & 1 & \cdots & 0 \\ \vdots & \vdots & \vdots & \ddots & \vdots \\ 0 & 0 & 0 & \cdots & 1 \\ \hline 1 & 1 & 1 & \cdots & 1 \\ 1 & x & x^2 & \cdots & x^{k-1} \\ 1 & x^2 & x^4 & \cdots & x^{2(k-1)} \\ \vdots & \vdots & \vdots & \ddots & \vdots \\ 1 & x^{m-1} & x^{2(m-1)} & \cdots & x^{(m-1)(k-1)} \end{pmatrix} \begin{matrix} \} k \text{ rows} \\ \\ \} m \text{ rows} \end{matrix} \qquad (7)$$

$k$ columns

Since the matrix A is a identity matrix up to the k-th row thereof, the first to k-th elements $b_0, \ldots, b_{k-1}$ of the output vector b agree with the elements $a_0, \ldots, a_{k-1}$ of the input vector a. The elements of the output vector b that agree with the corresponding elements of the input vector a are referred to as a "data share", and the other elements are referred to as a "parity share".

PRIOR ART LITERATURE

Non-Patent Literature

Non-patent literature 1: Bernard Sklar, "Digital Communications: Foundations and Applications," Pearson Education, 2006

SUMMARY OF THE INVENTION

Problems to be Solved by the Invention

The conventional error correcting coding technique has a problem that the processing amount is high. In particular, the processing amount of the field multiplication performed in the decoding process is high.

In view of such circumstances, an object of the present invention is to provide a decoding technique that can reduce the processing amount of a field multiplication involved in an encoding technique.

Means to Solve the Problems

To solve the problem described above, a decoding apparatus according to the present invention is a decoding apparatus, wherein x is an element of an irreducible polynomial f[X] that generates an extension field $GF(x^q)$, n and k are integers equal to or greater than 2, $n \geq 2k-1$, m denotes an integer equal to or greater than 1, m=n−k, a denotes a k-th order vector having elements $a_0, \ldots, a_{k-1}$ ($a_0, \ldots, a_{k-1} \in GF(x^q)$), A denotes a n-by-k matrix defined by the following formula:

$$A_{ij} = \begin{cases} 1 & \text{if } i = j \\ 0 & \text{if } i \neq j \text{ and } i < k \\ x^{(i-k)j} & \text{if } i \geq k \end{cases}$$

where
$i \in \{0, \ldots, n-1\}, j \in \{0, \ldots, k-1\},$ b denotes an n-th order vector having elements $b_0, \ldots, b_{n-1}$ ($b_0, \ldots, b_{n-1} \in GF(x^q)$) obtained by multiplying the vector a by the matrix A, φ denotes an integer equal to or greater than 1 and equal to or smaller than m, $d_0, \ldots, d_{k-\varphi-1}$ denote different integers equal to or greater than 0 and smaller than k, $e_0, \ldots, e_{\varphi-1}$ denote different integers equal to or greater than 0 and smaller than k that are different from $d_0, \ldots, d_{k-\varphi-1}, p_0, \ldots, p_{\varphi-1}$ denote different integers equal to or greater than k and smaller than n, and the decoding apparatus comprises:

a vector conversion part that generates a φ-th order vector b' using φ elements $b_{p0}, \ldots, b_{p\varphi-1}$ of the vector b according to the following formula:

$$b' = \begin{pmatrix} b'_0 \\ b'_1 \\ \vdots \\ b'_{\varphi-1} \end{pmatrix} = \begin{pmatrix} b_{p_0} - \sum_{i<k-\varphi} x^{p_0 d_i} b_{d_i} \\ b_{p_1} - \sum_{i<k-\varphi} x^{p_1 d_i} b_{d_i} \\ \vdots \\ b_{p_{\varphi-1}} - \sum_{i<k-\varphi} x^{p_{\varphi-1} d_i} b_{d_i} \end{pmatrix}$$

an inverse matrix generation part that generates a φ-by-φ inverse matrix $A'^{-1}$ according to the following formula:

$$A'^{-1} = \begin{pmatrix} x^{p_0 e_0} & x^{p_0 e_1} & \cdots & x^{p_0 e_{\varphi-1}} \\ x^{p_1 e_0} & x^{p_1 e_1} & \cdots & x^{p_1 e_{\varphi-1}} \\ \vdots & \vdots & \ddots & \vdots \\ x^{p_{\varphi-1} e_0} & x^{p_{\varphi-1} e_1} & \cdots & x^{p_{\varphi-1} e_{\varphi-1}} \end{pmatrix}^{-1};$$

a plaintext computation part that computes the elements $a_{e0}, \ldots, a_{e\varphi-1}$ of the vector a by multiplying the vector b' and the inverse matrix $A'^{-1}$.

Effects of the Invention

According to the present invention, the processing amount of a field multiplication involved in an encoding technique can be reduced.

DETAILED DESCRIPTION OF THE EMBODIMENTS

Figure 1:
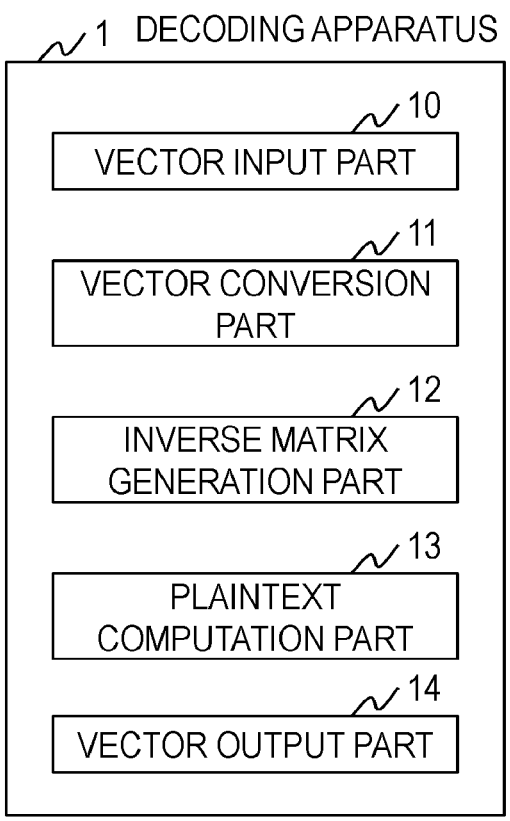
FIG. 1 is a diagram illustrating a functional configuration of a decoding apparatus.

Before describing an embodiment, a principle of the present invention will be described.

The following description will be made on the assumption that x represents an element X of an extension field $GF(2^{64})$ expressed by an irreducible polynomial $f[X]=X^{64}+X^4+X^3+X^2+X+1$. x is 2 in an integer expression.

$GF(2^{64})$ is a set of remainders of a division of a polynomial by a 64-th order polynomial f[X] whose coefficients are integers modulo 2 (division as polynomials). $GF(2^{64})$ is a field on which the four arithmetic operations are possible. $GF(2^{64})$ may also be regarded as a 64-th order vector of bits with a special arithmetic. $GF(2^{64})$ can be expressed by a 64-bit integer, a term $x^i$ of which is expressed as $2^i$. For example, $1+x+x^3$ is expressed as $2^0+2^1+2^3=11$.

Multiplication of a and b (a, b∈$GF(2^{64})$) is an operation of multiplying two 63-th order polynomials a and b (see the formula (8)) by each other and then dividing the product by the 64-th order polynomial f (see the formula (9)). A coefficient of a λ-th order term is expressed by the formula (10).

$$a = \sum_{i<64} a_i x^i, \quad b = \sum_{i<64} b_i x^i \quad (8)$$

$$\sum_{i<64} \sum_{j<64} a_i b_j x^{i+j} \bmod f \quad (9)$$

$$\bigoplus_{i+j=\lambda} a_i b_j \quad (10)$$

In the formula (9), a process of taking a modulus f of the 126-th order polynomial to provide a 63-th order polynomial is referred to as reduction. The reduction is achieved by using the equivalence relation expressed by the formula (11).

$$F = x^{64} + x^4 + x^3 + x + 1 = 0 \bmod f \quad (11)$$

The formula (11) can be transformed into the formula (12), which represents a relation that reduces the 64-th order term to a fourth-order formula.

$$x^{64} = x^4 + x^3 + x + 1 \bmod f \quad (12)$$

As shown by the formula (13), the order of any 64-th or higher order term can be reduced by 60.

$$x^{64+n} = x^n(x^4 + x^3 + x + 1) \bmod f \quad (13)$$

The 126-th order polynomial can be expressed by a 63-th order polynomial g and a 62-th order polynomial h according to the formula (14).

$$g + x^{64} h = g + (x^4 + x^3 + x + 1) h \bmod f \quad (14)$$

A multiplication (x+1)a of an arbitrary element a and x+1 can be expressed by the formula (15).

$$xa + a = xa \oplus a \quad (15)$$

In addition, since the order of each term of $x^n a$ is n higher than the order of the corresponding term of a, each term of $x^n a$ is equivalent to $2^n$ times the term in the integer expression or the term left-shifted by n bits. Thus, $x^n a$ can be expressed by the formula (16).

$$(x^4 + x^3 + x + 1)h = (h << 4) \oplus (h << 3) \oplus (h << 1) \oplus h \quad (16)$$

Since h is a 62-th order polynomial, the term $$(h << 4) \oplus (h << 3)$$

in the formula (16) is a 64-th or higher order polynomial, and the order needs to be further reduced. The part of 64-th or higher order is expressed by the formula (17).

$$x^4(h_{62}x^{62} + h_{61}x^{61} + h_{60}x^{60}) + x^3(h_{62}x^{62} + h_{61}x^{61}) = x^{64}((h>>60) \oplus (h>>61)) \quad (17)$$

Considering that in the case of the 64-bit integer, any number is truncated to 64 bits, computation can be performed according to the formula (18).

$$X^{64}(h \oplus (h >> 60) \oplus (h >> 61)) = \qquad (18)$$
$$(x^4 + x^3 + x + 1)(h \oplus (h >> 60) \oplus (h >> 61)) =$$
$$(x^3 + 1)(x + 1)(h \oplus (h >> 60) \oplus (h >> 61))$$

In multiplication, if one of the multiplier is a number with 61 bits or a smaller number of bits (more strictly, if the total number of bits of the multipliers is equal to or less than 125), the formula (19) holds, so that the reduction can be made more efficient.

$$(h >> 60) \oplus (h >> 61) = 0 \qquad (19)$$

Thus, considering the processing amount including the reduction, the multiplication by a 61-bit number with only one bit being 1 (in other words, $2^i$ where $0 \le i \le 60$) is quick.

As described above, in the decoding process for an error correcting code, the vector a in the form of a plaintext is decoded by multiplying the vector b' formed by extracting elements of the vector b used for decoding by the inverse matrix of the matrix A' formed by extracting rows corresponding to the elements of the vector b' of the matrix A used for encoding. If all the data shares $b_0, \ldots, b_{k-1}$ are available, the data shares are the elements of the input vector themselves, so that the input can be used as it is. On the other hand, if any data share is unavailable, the plaintext needs to be reconstructed from the available data shares and a parity share.

Reconstruction of the plaintext is performed as described below. It is assumed that there is $\phi$ unavailable data shares, where $\phi \le m$. Conceptually, it is enough to extract $\phi$ rows of the inverse matrix and multiply the available data shares by extracted $\phi$ rows. In general, however, the elements of the inverse matrix are not x to the power of up to 60, so that the processing amount in the case of the multiplication by $\phi$ rows is expressed by the formula (20). In the formula, MUL represents the processing amount of one carry-less multiplication, and RED represents the processing amount of one reduction. The carry-less multiplication can be achieved by one PCLMUL instruction with a Sandy-bridge or later CPU available from Intel® Corporation or a Bulldozer or later CPU available from AMD® Inc.

$$\phi(k\text{MUL} + \text{RED}) \qquad (20)$$

Instead of multiplication by the inverse matrix itself, taking advantage of the fact that the data share has only one element of the input vector, elements of the input vector that correspond to the data shares are first removed from the parity shares. For example, as shown by the formula (21), the 0-th element of the plaintext can be removed from the parity share $b_p$ (where p denotes an identification number of any parity share) by using the data share $b_0$.

Since $b_0 = (1\ 0\ 0\ \ldots\ 0)a$, and $$b_p = (1 x^{pk}\ x^{(p-k)2}\ \ldots\ x^{(p-k)(k-1)})a,$$

$$b_p - b_0 = (0\ x^{p-k}\ x^{(p-k)2}\ \ldots\ x^{(p-k)(k-1)})a \qquad (21)$$

By using such a transformation, elements $a_{e_0}, \ldots, a_{e_{\phi-1}}$ of the vector a to be reconstructed can be expressed by a $\phi$-th order square matrix whose order is lower than k.

$$\begin{pmatrix} b_{p_0} - \sum_{i<k-\phi} x^{p_0 d_i} b_{d_i} \\ b_{p_1} - \sum_{i<k-\phi} x^{p_1 d_i} b_{d_i} \\ \vdots \\ b_{p_{\phi-1}} - \sum_{i<k-\phi} x^{p_{\phi-1} d_i} b_{d_i} \end{pmatrix} = \qquad (22)$$

$$\underbrace{\begin{pmatrix} x^{p_0 e_0} & x^{p_0 e_1} & \ldots & x^{p_0 e_{\phi-1}} \\ x^{p_1 e_0} & x^{p_1 e_1} & \ldots & x^{p_1 e_{\phi-1}} \\ \vdots & \vdots & \ddots & \vdots \\ x^{p_{\phi-1} e_0} & x^{p_{\phi-1} e_1} & \ldots & x^{p_{\phi-1} e_{\phi-1}} \end{pmatrix}}_{\phi \text{ columns}} \begin{pmatrix} a_{e_0} \\ a_{e_1} \\ \vdots \\ a_{e_{\phi-1}} \end{pmatrix} \bigg\} \phi \text{ rows}$$

In the formula, $d_0, \ldots, d_{k-\phi-1}$ are identification numbers of the available data shares, $e_0, \ldots, e_{\phi-1}$ are identification numbers of the unavailable data shares, and $p_0, \ldots, p_{\phi-1}$ are identification numbers of the parity shares used for the reconstruction. That is, $d_0, \ldots, d_{k-\phi-1}$ denote different integers equal to or greater than 0 and smaller than k, $e_0, \ldots, e_{\phi-1}$ denote different integers equal to or greater than 0 and smaller than k that are different from $d_0, \ldots, d_{k-\phi-1}$, and $p_0, \ldots, p_{\phi-1}$ denote different integers equal to or greater than k and smaller than n.

The left-hand side of the formula (22) is designated as the vector b', and the plaintext can be reconstructed by multiplying the vector b' by an inverse matrix of the $\phi$-th order square matrix.

$$\begin{pmatrix} x^{p_0 e_0} & x^{p_0 e_1} & \ldots & x^{p_0 e_{\phi-1}} \\ x^{p_1 e_0} & x^{p_1 e_1} & \ldots & x^{p_1 e_{\phi-1}} \\ \vdots & \vdots & \ddots & \vdots \\ x^{p_{\phi-1} e_0} & x^{p_{\phi-1} e_1} & \ldots & x^{p_{\phi-1} e_{\phi-1}} \end{pmatrix}^{-1} \begin{pmatrix} b'_0 \\ b'_1 \\ \vdots \\ b'_{\phi-1} \end{pmatrix} = \begin{pmatrix} a_{e_0} \\ a_{e_1} \\ \vdots \\ a_{e_{\phi-1}} \end{pmatrix} \qquad (23)$$

where $$b' = \begin{pmatrix} b'_0 \\ b'_1 \\ \vdots \\ b'_{\phi-1} \end{pmatrix} = \begin{pmatrix} b_{p_0} - \sum_{i<k-\phi} x^{p_0 d_i} b_{d_i} \\ b_{p_1} - \sum_{i<k-\phi} x^{p_1 d_i} b_{d_i} \\ \vdots \\ b_{p_{\phi-1}} - \sum_{i<k-\phi} x^{p_{\phi-1} d_i} b_{d_i} \end{pmatrix}$$

The processing amount required to generate the vector b' is expressed by the formula (24). In the formula, BMUL represents the processing amount of one multiplication one of whose multiplier is a monomial, and BRED represents the processing amount of one reduction involved in a multiplication the total of the orders of the highest-order terms of whose multipliers is equal to or smaller than $2q-d-1$.

$$(k-\phi)\phi \text{BMUL} + \phi \text{BRED} \qquad (24)$$

The processing amount required for the multiplication of the vector b' by the $\phi$-th order inverse matrix is expressed by the formula (25).

$$\phi^2 \text{MUL} + \phi \text{RED} \qquad (25)$$

Thus, the total processing amount is expressed by the formula (26), which is the sum of the formulas (24) and (25).

$$\phi((k-\phi)B\text{MUL}+\phi\text{MUL}+B\text{RED}+\text{RED}) \quad (26)$$

If there is one unavailable data share, that is, if $\phi=1$, the formula (23) can be rewritten as the formula (27). Thus, an inverse element of $x^{p_0 e_0}$ can be calculated in advance, and $b'_0$ can be multiplied by the inverse element.

$$(x^{p_0 e_0})^{-1}(b'_0)=(a_{e_0}) \quad (27)$$

If there are two to four unavailable data shares, that is, if $2 \leq \phi \leq 4$, the order can be further reduced by one. If $\phi \geq 2$, all the elements of the $\phi$-th order square matrix expressed by the formula (22) are powers of x. Thus, if the parity shares are arranged according to $p_0 < p_1 < \ldots < p_{\phi-1}$, the order can be further reduced by one in BMUL and BRED as shown by the formula (28).

$$\begin{pmatrix} x^{p_1 e_1} - x^{p_0 e_1 + (p_1 - p_0)e_0} & \cdots & x^{p_1 e_{\phi-1}} - x^{(p_1 - p_0)e_0} \\ x^{p_2 e_1} - x^{p_0 e_1 + (p_2 - p_0)e_0} & \cdots & x^{p_2 e_{\phi-1}} - x^{(p_2 - p_0)e_0} \\ \vdots & \ddots & \vdots \\ x^{p_{\phi-1} e_1} - x^{p_0 e_1 + (p_{\phi-1} - p_0)e_0} & \cdots & x^{p_{\phi-1} e_{\phi-1}} - x^{(p_{\phi-1} - p_0)e_0} \end{pmatrix}^{-1} \quad (28)$$

$\phi-1$ rows $\phi-1$ columns $$\begin{pmatrix} b'_1 - x^{(p_1 - p_0)e_0} b'_0 \\ b'_2 - x^{(p_2 - p_0)e_0} b'_0 \\ \vdots \\ b'_{\phi-1} - x^{(p_{\phi-1} - p_0)e_0} b'_0 \end{pmatrix} = \begin{pmatrix} a_{e_1} \\ a_{e_2} \\ \vdots \\ a_{e_{\phi-1}} \end{pmatrix}$$

The remaining $a_{e_0}$ is calculated using $a_{e_1}, \ldots, a_{e_{\phi-1}}$ determined from the formula (28) according to the formula (29).

$$a_{e_0} = x^{-p_0 e_0}\left(b'_0 - \sum_{1 \leq i < \phi} x^{p_0 e_i} a_{e_i}\right) \quad (29)$$

In this case, the processing amount is expressed by the formula (30).

$$(k-\phi)\phi B\text{MUL}+\phi B\text{RED}+(\phi-1)B\text{MUL}+(\phi-1)B\text{RED}+ \\ (\phi-1)^2\text{MUL}+(\phi-1)\text{RED}+(\phi-1)B\text{MUL}+B\text{RED}+ \\ \text{MUL}+\text{RED}=\phi((k-\phi+2)B\text{MUL}+(\phi-2)\text{MUL}+ \\ 2B\text{RED}+\text{RED})+2(-B\text{MUL}+\text{MUL}) \quad (30)$$

It will be now described that the formula (30) shows a reduced processing amount. First, the total of BMUL and MUL is k$\phi$ in all of the formulas (20), (26) and (30). Next, it will be confirmed that MUL has been reduced. MUL is k$\phi$ in the formula (20), 2$\phi$ in the formula (26) and $\phi^2-2\phi+2$ in the formula (30). If $\phi \geq 2$, a relation holds: formula (30) <formula (26)<formula (20). In terms of RED, a relation holds: formula (30)=formula (26)<formula (20). BRED increases with formula: BRED is 0 in the formula (20), $\phi$ in the formula (26) and 2$\phi$ in the formula (30). However, if $\phi \geq 2$, the increment is equal to or smaller than the reduction in MUL. Thus, if a relation BRED+BMUL<MUL holds, the total processing amount is reduced. If $\phi \geq 5$, both of $b'_i$ and $b'_i - x^{(p_i - p_0)e_0} b'_0$ cannot be held for each i, and an overhead of loading/storing occurs, so that this order reduction is not performed.

If there are two unavailable data shares, $\phi-1=1$. Thus, as in the case where $\phi=1$, the formula (28) can be rewritten as the formula (31). Thus, an inverse element of $x^{p_1 e_1} - x^{p_0 e_1 + (p_1 - p_0)e_0}$ can be calculated in advance, and $b'_1$ can be multiplied by the inverse element. Then, $a_{e_0}$ is reconstructed according to the formula (29).

$$(x^{p_1 e_1} - x^{p_0 e_1 + (p_1 - p_0)e_0})^{-1}(b'_1)=(a_{e_0}) \quad (31)$$

If there are three or more unavailable data shares, the processing amount when the multiplication by the inverse matrix is performed is expressed by the formula (32).

$$\phi^2 \text{MUL}+\phi\text{RED} \quad (32)$$

If one ($a_{e_0}$, for example) of $a_{e_0}, \ldots, a_{e_{\phi-1}}$ is reconstructed, the required processing amount is expressed by the formula (33).

$$\phi\text{MUL}+\text{RED} \quad (33)$$

Then, in the same manner as in the case of the reduction of data-share components, the processing amount can be reduced by one order as expressed by the formula (34).

$$(\phi-1)(B\text{MUL}+B\text{RED}) \quad (34)$$

After such an order reduction is repeated, and the processing amount is expressed by the formula (35).

$$\phi(\phi+1)/2\text{MUL}+\phi(\phi-1)/2B\text{MUL}+\phi\text{RED}+\phi(\phi-1)/ \\ 2B\text{RED} \quad (35)$$

Comparing with the formula (26), the sum of MUL and BMUL is the same, and the ratio of MUL is reduced by approximately half, although only BRED has increased. However, the increment is equal to the reduction in MUL, so that if BUL+BRED<MUL, the total processing amount has decreased.

The formula (35) shows the minimum absolute computation amount. However, the method of reconstructing the data shares one by one and repeating removal of the data-share component from the parity shares has a problem that the parallelism of MUL and RED decreases. Comparing the multiplication by the inverse matrix that has a high level of parallelism, the number of processings that can only sequentially be performed increases, so that the performance of the CPU may decrease depending on the number of MULs or REDs that can be executed in parallel by the CPU. Thus, it can be concluded that a method of using the inverse matrix to reconstruct a number of data shares equal to the number of MULs or REDs that can be executed in parallel by the CPU and removing the reconstructed components from the parity shares each time the data shares are reconstructed is the quickest. The number of MULs that can be executed in parallel is 1 and 2 for Ivy-Bridge and Haswell available from Intel Corporation, respectively, and the number of REDs that can be executed in parallel is 2 for both Ivy-Bridge and Haswell.

An example of an algorithm that implements the decoding process for the error correcting code described above is expressed by the following formula. In the formula, f denotes the number of unavailable data shares, $d_0, \ldots, d_{k-f-1}$ are identification number of k-f available data shares, $p_0, \ldots, p_{f-1}$ are identification numbers of f available parity shares, $e_0, \ldots, e_{f-1}$ are identification numbers of plaintexts to be reconstructed, k-f data shares $b_{d_0}, \ldots, b_{d_{k-f-1}}$ and f parity shares $b_{p_0}, \ldots, b_{p_{f-1}}$ are inputs, a row $C_0, \ldots$ of a coefficient matrix and coefficients $c_0$ and $c_1$ are auxiliary inputs, and plaintexts $a_{e_0}, \ldots, a_{e_{f-1}}$ are outputs.

1:
$$b' := \begin{pmatrix} b'_0 \\ b'_1 \\ \vdots \\ b'_{f-1} \end{pmatrix} = \begin{pmatrix} b_{p_0} - \sum_{i<f} x^{p_0 d_i} b_{d_i} \\ b_{p_1} - \sum_{i<f} x^{p_1 d_i} b_{d_i} \\ \vdots \\ b_{p_{f-1}} - \sum_{i<f} x^{p_{f-1} d_i} b_{d_i} \end{pmatrix}$$

2:  if f ∈ {3,4} then

3:
$$b'' := \begin{pmatrix} b''_0 \\ b''_1 \\ \vdots \\ b''_{f-2} \end{pmatrix} = \begin{pmatrix} b'_1 - x^{(p_1-p_0)e_0} b'_0 \\ b'_2 - x^{(p_2-p_0)e_0} b'_0 \\ \vdots \\ b'_{f-1} - x^{(p_{f-1}-p_0)e_0} b'_0 \end{pmatrix}$$

4:  f' := f − 1
5:  else
6:  b'' := b' (just regarded as being so and not copied or otherwise used.)
7:  f' := f
8:  i := 0
9:  while f' > 2 do 10:
$$\begin{pmatrix} a_{e_{f'-1}} \\ a_{e_{f'-2}} \end{pmatrix} = \begin{pmatrix} (C_i)_{00} & (C_i)_{01} & \cdots & (C_1)_{0(f'-1)} \\ (C_i)_{10} & (C_i)_{11} & \cdots & (C_1)_{1(f'-1)} \end{pmatrix} \begin{pmatrix} b''_0 \\ b''_1 \\ \vdots \\ b''_{f'-1} \end{pmatrix}$$

11:
$$b' := \begin{pmatrix} b'_0 \\ b'_1 \\ \vdots \\ b'_{f'-3} \end{pmatrix} = \begin{pmatrix} b'_0 - \sum_{f'-2 \leq i < f'} x^{p_0 e_i} a_{e_i} \\ b'_1 - \sum_{f'-2 \leq i < f'} x^{p_1 e_i} a_{e_i} \\ \vdots \\ b'_{f'-3} - \sum_{f'-2 \leq i < f'} x^{p_{f'-3} e_i} a_{e_i} \end{pmatrix} \text{(update)}$$

12:  f' := f' − 2
13:  if f' = 2 then
14:  $a_{e_1} := c_1 b_1'$, where $c_1 = (x^{p_1 e_1} - x^{p_0 e_1 + (p_1-p_0)e_0})^{-1}$
15:  $b_0' := x^{p_0 e_1} a_{e_1}$ (update)
16:  $a_{e_0} := c_0 b_0'$, where $c_0 = (x^{p_0 e_0})^{-1}$ The coefficient matrix $C_i$ and the coefficients $c_0$ and $c_1$, which are auxiliary inputs, are set as follows depending on the value of ϕ.

If ϕ=1, $c_0$ in the following formula is the only coefficient. Since $c_0$ is an inverse element of a power of x, $c_0$ can be calculated only by referring to a table.

$$c_0 = (x^{p_0 e_0})^{-1}$$

If ϕ=2, $c_1$ in the following formula is also used in addition to $c_0$ described above.

$$c_1 = (x^{p_1 e_1} - x^{p_0 e_1 + (p_1-p_0)e_0})^{-1}$$

If ϕ=3, in addition to $c_0$ and $c_1$ described above, an inverse matrix of the ϕ−1-th order square matrix of the left-hand side of the formula (28) is used.

If ϕ=4, $c_0$ and $c_1$ described above and the first (numbered 0) and second rows of the inverse matrix of the ϕ−1-th order square matrix of the left-hand side of the formula (28) are used. Each of the rows of the inverse matrix is equal to a sequence of coefficients used to reconstruct one plaintext share. Considering the number of MULs or REDs that can be executed in parallel by the CPU described above, the plaintext shares can be efficiently reconstructed on a two-by-two basis from the end to the beginning, so that only the last two rows are needed.

If ϕ=5, as in the case where ϕ=4, the plaintext shares are reconstructed on a two-by-two basis from the end to the beginning, so that the last two rows of an inverse matrix of the ϕ-th order square matrix are first needed. The last two rows of an inverse matrix of the remaining ϕ−2-th square matrix are then needed. In this way, for each i that satisfies a relation ϕ−2i<3, the last two rows of an inverse matrix of the ϕ−2i-th square matrix in the upper left part of the ϕ-th square matrix are needed. There is no need to determine ϕ/2 inverse matrices, and only one triangulation is needed. This is because, in both triangulation and backward substitution, the upper left part of the matrix is not affected by the lower right part, and a triangular matrix of a matrix minus the rightmost two columns and the bottom two rows is the same as a triangular matrix of the whole of the matrix minus the rightmost two columns and the bottom two rows.

In the following, an embodiment of the present invention will be described in detail. In the drawings, components having the same function are denoted by the same reference numerals, and redundant descriptions thereof will be omitted.

As illustrated in FIG. 1, a decoding apparatus 1 according to the embodiment comprises a vector input part 10, a vector conversion part 11, an inverse matrix generation part 12, a plaintext computation part 13, and a vector output part 14. A decoding method according to the embodiment is achieved by the decoding apparatus 1 performing processings in steps illustrated in FIG. 2.

The decoding apparatus 1 is a special apparatus formed by a well-known or dedicated computer in which a special program is loaded, the computer having a central processing unit (CPU: Central Processing Unit), a main memory (RAM: Random Access Memory), and other components. The decoding apparatus 1 performs the processings under the control of the central processing unit. Data input to the decoding apparatus 1 and data resulting from the processings are stored in the main memory, and the data stored in the main memory is loaded to the central processing unit and used for other processings. At least part of the processing parts of the decoding apparatus 1 may be formed by hardware, such as an integrated circuit.

Figure 2:
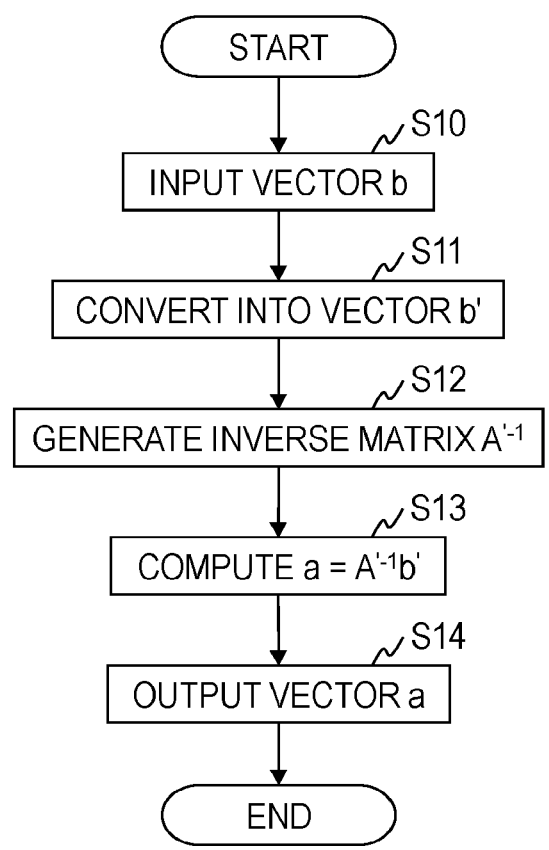
FIG. 2 is a diagram illustrating a process flow of a decoding method.

With reference to FIG. 2, a procedure of the decoding method according to the embodiment will be described.

In step S10, an n-th order vector b is input to the vector input part 10. ϕ available elements $b_{p0}, \ldots, b_{pϕ-1}$ ($b_{p0}, \ldots, b_{pϕ-1} \in GF(x^q)$) of the parity shares of the n-th order vector b are fed to the vector conversion part 11. In addition, k−ϕ available elements $b_{d0}, \ldots, b_{dk-ϕ-1}$ of the data shares of the vector b are fed to the vector output part 14. The vector b is an n-th order vector obtained by multiplying a k-th order vector a defined by the formula (36) by an n-by-k matrix A defined by the formula (37).

$$a = \begin{pmatrix} a_0 \\ \vdots \\ a_{k-1} \end{pmatrix} \quad (36)$$

$$A_{ij} = \begin{cases} 1 & \text{if } i = j \\ 0 & \text{if } i \neq j \text{ and } i < k \\ x^{(i-k)j} & \text{if } i \geq k \end{cases} \quad (37)$$

where $i \in \{0, \ldots, n-1\}, j \in \{0, \ldots, k-1\}$

In step S11, the vector conversion part 11 generates a φ-th order vector b' using $b_{p_0}, \ldots, b_{p_{\phi-1}}$ according to the formula (38). The vector b' is fed to the plaintext computation part 13.

$$b' = \begin{pmatrix} b'_0 \\ b'_1 \\ \vdots \\ b'_{\phi-1} \end{pmatrix} = \begin{pmatrix} b_{p_0} - \sum_{i<k-\phi} x^{p_0 d_i} b_{d_i} \\ b_{p_1} - \sum_{i<k-\phi} x^{p_1 d_i} b_{d_i} \\ \vdots \\ b_{p_{\phi-1}} - \sum_{i<k-\phi} x^{p_{\phi-1} d_i} b_{d_i} \end{pmatrix} \quad (38)$$

In step S12, the inverse matrix generation part 12 generates a φ-by-φ inverse matrix $A'^{-1}$ according to the formula (39). The inverse matrix $A'^{-1}$ is fed to the plaintext computation part 13. Since if the φ of the k parity shares used for reconstruction are determined, the inverse matrix $A'^{-1}$ can be generated, the inverse matrix $A'^{-1}$ may be computed in advance for all of the φ combinations. In that case, the inverse matrix generation part 12 has only to select an appropriate one of the inverse matrices generated in advance.

$$A'^{-1} = \begin{pmatrix} x^{p_0 e_0} & x^{p_0 e_1} & \ldots & x^{p_0 e_{\phi-1}} \\ x^{p_1 e_0} & x^{p_1 e_1} & \ldots & x^{p_1 e_{\phi-1}} \\ \vdots & \vdots & \ddots & \vdots \\ x^{p_{\phi-1} e_0} & x^{p_{\phi-1} e_1} & \ldots & x^{p_{\phi-1} e_{\phi-1}} \end{pmatrix}^{-1} \quad (39)$$

In step S13, the plaintext computation part 13 computes elements $a_{e_0}, \ldots, a_{e_{\phi-1}}$ of the vector a by multiplying the vector b' by the inverse matrix $A'^{-1}$ according to the formula (40). The elements $a_{e_0}, \ldots, a_{e_{\phi-1}}$ are fed to the vector output part 14.

$$\begin{pmatrix} x^{p_0 e_0} & x^{p_0 e_1} & \ldots & x^{p_0 e_{\phi-1}} \\ x^{p_1 e_0} & x^{p_1 e_1} & \ldots & x^{p_1 e_{\phi-1}} \\ \vdots & \vdots & \ddots & \vdots \\ x^{p_{\phi-1} e_0} & x^{p_{\phi-1} e_1} & \ldots & x^{p_{\phi-1} e_{\phi-1}} \end{pmatrix}^{-1} \begin{pmatrix} b'_0 \\ b'_1 \\ \vdots \\ b'_{\phi-1} \end{pmatrix} = \begin{pmatrix} a_{e_0} \\ a_{e_1} \\ \vdots \\ a_{e_{\phi-1}} \end{pmatrix} \quad (40)$$

In step S14, the vector output part 14 reconstructs the k-th order vector a by using as elements thereof the k−φ elements $b_{d_0}, \ldots, b_{d_{k-\phi-1}}$ received from the vector input part 10 and the 4 elements $a_{e_0}, \ldots, a_{e_{\phi-1}}$ computed by the plaintext computation part 13, and outputs the vector a.

The decoding apparatus according to the embodiment configured as described above performs decoding by reducing the order of the matrix A' from the k-th order square matrix to the φ-th order square matrix and then applying the inverse matrix $A'^{-1}$. Thus, φ(k−φ) polynomial multiplications of φk polynomial multiplications are less computationally intensive polynomial multiplications that involve only transposition of terms, so that the decoding process is efficient. The computation amount of an ordinary polynomial multiplication is $q^2$ for an extension degree q. On the other hand, the computation amount of the multiplication involving only transposition of terms is q if the transportation actually occurs and 1 if a flag of the transposition amount is set.

The decoding technique according to the present invention can be applied to the computational secret sharing. The computational secret sharing is a secret sharing scheme that inhibits reconstruction of original data from a number of variances smaller than a predetermined number based on the computational security. The computational secret sharing is described in the reference literature 1 listed below, for example.

[Reference Literature 1] H. Krawczyk, "Secret sharing made short.", CRYPTO 1993, pp. 136-146, 1993

The present invention is not limited to the embodiment described above, and modifications can be made as required without departing from the spirit of the present invention. The various processings described above with regard to the embodiment are not necessarily sequentially performed in the order described above but also can be performed in parallel with or independently of each other depending on the processing capacity of the apparatus that performs the processings or as required.

[Program and Storage Medium]

When a computer carries out the various processing functions of the apparatus according to the embodiment described above, the specific processings of the functions that the apparatus needs to have are described in a program. The various processing functions of the apparatus described above are implemented on the computer by the computer executing the program.

The program that describes the specific processings can be recorded in a computer readable recording medium. Any computer readable recording medium can be used, such as a magnetic recording device, an optical disk, a magneto-optical recording medium, or a semiconductor memory.

The program can be distributed by selling, transferring or lending a portable recording medium, such as a DVD, a CD-ROM, or an USB memory, on which the program is recorded, for example. Furthermore, the program may be distributed by storing the program in a memory of a server computer and transferring the program from the server computer to another computer.

The computer that executes the program first temporarily stores, in a memory thereof, the program recorded on a portable recording medium or transferred from a server computer, for example. When performing the processings, the computer reads the program from the memory of the computer and performs the processings according to the read program. In an alternative implementation, the computer may read the program directly from the portable recording medium and perform the processings according to the program, or the computer may perform the processings according to the program each time the computer receives the program transferred from the server computer. As a further alternative, the processings described above may be performed on an application service provider (ASP) basis, in which the server computer does not transfer the program to the computer, and the processings are implemented only through execution instruction and result acquisition. The program according to the embodiment of the present invention include a quasi-program, which is information to be processed by a computer (such as data that is not a direct instruction to a computer but has a property that defines the processings performed by the computer).

Although the apparatus according to the embodiment of the present invention have been described as being implemented by a computer executing a predetermined program, at least part of the specific processings may be implemented by hardware.

What is claimed is:

1. A decoding apparatus,
wherein x is an element of an irreducible polynomial f[X] that generates an extension field $GF(x^q)$, n and k are integers equal to or greater than 2, $n \geq 2k-1$, m denotes an integer equal to or greater than 1, $m=n-k$, vector a denotes a k-th order vector having elements $a_0, \ldots, a_{k-1}$ ($a_0, \ldots, a_{k-1} \in GF(x^q)$), A denotes a n-by-k matrix defined by the following formula:

$$A_{ij} = \begin{cases} 1 & \text{if } i = j \\ 0 & \text{if } i \neq j \text{ and } i < k \\ x^{(i-k)j} & \text{if } i \geq k \end{cases}$$

where $i \in \{0, \ldots, n-1\}, j \in \{0, \ldots, k-1\}$, vector b denotes an n-th order vector having elements $b_0, \ldots, b_{n-1}$ ($b_0, \ldots, b_{n-1} \in GF(x^q)$) obtained by multiplying the vector a by the matrix A, $\phi$ denotes an integer equal to or greater than 1 and equal to or smaller than m, $d_0, \ldots, d_{k-\phi-1}$ denote different integers equal to or greater than 0 and smaller than k, $e_0, \ldots, e_{\phi-1}$ denote different integers equal to or greater than 0 and smaller than k that are different from $d_0, \ldots, d_{k-\phi-1}$, $p_0, \ldots, p_{\phi-1}$ denote different integers equal to or greater than k and smaller than n, and
the decoding apparatus comprises:
circuitry configured to:
receive the vector b as an input from an encoding apparatus over a communications channel;
generate a $\phi$-th order vector b' using $\phi$ elements $b_{p0}, \ldots, b_{p\phi-1}$ of the vector b, for $n=p_\phi$ according to the following formula:

$$b' = \begin{pmatrix} b'_0 \\ b'_1 \\ \vdots \\ b'_{\phi-1} \end{pmatrix} = \begin{pmatrix} b_{p_0} - \sum_{i<k-\phi} x^{p_0 d_i} b_{d_i} \\ b_{p_1} - \sum_{i<k-\phi} x^{p_1 d_i} b_{d_i} \\ \vdots \\ b_{p_{\phi-1}} - \sum_{i<k-\phi} x^{p_{\phi-1} d_i} b_{d_i} \end{pmatrix}$$

generate a $\phi$-by-$\phi$ inverse matrix $A'^{-1}$ according to the following formula:

$$A'^{-1} = \begin{pmatrix} x^{p_0 e_0} & x^{p_0 e_1} & \cdots & x^{p_0 e_{\phi-1}} \\ x^{p_1 e_0} & x^{p_1 e_1} & \cdots & x^{p_1 e_{\phi-1}} \\ \vdots & \vdots & \ddots & \vdots \\ x^{p_{\phi-1} e_0} & x^{p_{\phi-1} e_1} & \cdots & x^{p_{\phi-1} e_{\phi-1}} \end{pmatrix}^{-1};$$

and
compute the elements $a_{e0}, \ldots, a_{e\phi-1}$ of the vector a, as an output, by multiplying the vector b' and the inverse matrix $A'^{-1}$, the vector a corresponding to a plaintext input to the encoding apparatus.

2. The decoding apparatus according to claim 1, wherein $\phi$ denotes an integer within a range equal to or greater than 2 and equal to or smaller than 4,
the circuitry configured to generate a $\phi$-1-th order vector b" using the vector b'according to the following formula:

$$b'' = \begin{pmatrix} b''_0 \\ b''_1 \\ \vdots \\ b''_{\phi-2} \end{pmatrix} = \begin{pmatrix} b'_1 - x^{(p_1-p_0)e_0} b'_0 \\ b'_2 - x^{(p_2-p_0)e_0} b'_0 \\ \vdots \\ b'_{\phi-1} - x^{(p_{\phi-1}-p_0)e_0} b'_0 \end{pmatrix},$$

generate a $\phi$-1-by-$\phi$-1 inverse matrix $A''^{-1}$ according to the following formula:

$$A''^{-1} = \begin{pmatrix} x^{p_1 e_1} - x^{p_0 e_1 + (p_1-p_0)e_0} & \cdots & x^{p_1 e_{\phi-1}} - x^{(p_1-p_0)e_0} \\ x^{p_2 e_1} - x^{p_0 e_1 + (p_2-p_0)e_0} & \cdots & x^{p_2 e_{\phi-1}} - x^{(p_2-p_0)e_0} \\ \vdots & \ddots & \vdots \\ x^{p_{\phi-1} e_1} - x^{p_0 e_1 + (p_{\phi-1}-p_0)e_0} & \cdots & x^{p_{\phi-1} e_{\phi-1}} - x^{(p_{\phi-1}-p_0)e_0} \end{pmatrix}^{-1},$$

and
compute the elements $a_{e1}, \ldots, a_{e\phi-1}$ of the vector a by multiplying the vector b" and the inverse matrix $A''^{-1}$ and computes the element $a_{e0}$ of the vector a according to the following formula:

$$a_{e0} = x^{-p_0 e_0} \left( b'_0 - \sum_{1 \leq i < \phi} x^{p_0 e_i} a_{e_i} \right).$$

3. The decoding apparatus according to claim 2, wherein the circuitry is configured to compute the elements $a_{e2}, \ldots, a_{e\phi-1}$ of the vector a by repeating parallel multiplications of the last two rows of a $\phi$-2i-th order square matrix in an upper left part of the inverse matrix $A''^{-1}$ by the 0-th to $\phi$-2i-1-th elements of the vector b" for i that satisfies a relation $\phi-2i<3$, compute the element $a_{e1}$ of the vector a according to the following formula:

$$a_{e1} = c_1 b'_1$$

where $c_1 = (x^{p_1 e_1} - x^{p_0 e_1 + (p_1-p_0)e_0})^{-1}$, and compute the element $a_{e0}$ of the vector a according to the following formula:

$$a_{e0} = c_0 b'_0;$$

where $b'_0 = x^{p_0 e_1} a_{e_1}, c_0 = (x^{p_0 e_0})^{-1}$.

4. The decoding apparatus according to claim 1, wherein x=2, and
the circuitry is configured to perform an exclusive-OR operation as an addition and perform a bit shift operation as a polynomial multiplication.

5. A decoding method,
wherein x is an element of an irreducible polynomial f[X] that generates an extension field $GF(x^q)$, n and k are integers equal to or greater than 2, $n \geq 2k-1$, m denotes an integer equal to or greater than 1, $m=n-k$, vector a denotes a k-th order vector having elements $a_0, \ldots,$ $a_{k-1}$ ($a_0, \ldots, a_{k-1} \in GF(x^q)$), A denotes a n-by-k matrix defined by the following formula:

$$A_{ij} = \begin{cases} 1 & \text{if } i = j \\ 0 & \text{if } i \neq j \text{ and } i < k \\ x^{(i-k)j} & \text{if } i \geq k \end{cases}$$

where $i \in \{0, \ldots, n-1\}, j \in \{0, \ldots, k-1\}$, vector b denotes an n-th order vector having elements $b_0, \ldots, b_{n-1}$ ($b_0, \ldots, b_{n-1} \in GF(x^q)$) obtained by multiplying the vector a by the matrix A, φ denotes an integer equal to or greater than 1 and equal to or smaller than m, $d_0, \ldots, d_{k-\phi-1}$ denote different integers equal to or greater than 0 and smaller than k, $e_0, \ldots, e_{\phi-1}$ denote different integers equal to or greater than 0 and smaller than k that are different from $d_0, \ldots, d_{k-\phi-1}$, $p_0, \ldots, p_{\phi-1}$ denote different integers equal to or greater than k and smaller than n, and the decoding method, which is implemented by a decoding apparatus, comprises:

receiving the vector b as an input from an encoding apparatus over a communications channel;

generating, by circuitry of a decoding apparatus, a φ-th order vector b' using φ elements $b_{p_0}, \ldots, b_{p_{\phi-1}}$ of the vector b, for $n = p_\phi$, according to the following formula:

$$b' = \begin{pmatrix} b'_0 \\ b'_1 \\ \vdots \\ b'_{\phi-1} \end{pmatrix} = \begin{pmatrix} b_{p_0} - \sum_{i<k-\phi} x^{p_0 d_i} b_{d_i} \\ b_{p_1} - \sum_{i<k-\phi} x^{p_1 d_i} b_{d_i} \\ \vdots \\ b_{p_{\phi-1}} - \sum_{i<k-\phi} x^{p_{\phi-1} d_i} b_{d_i} \end{pmatrix}$$

generating, by circuitry of the decoding apparatus, a φ-by-φ inverse matrix $A'^{-1}$ according to the following formula:

$$A'^{-1} = \begin{pmatrix} x^{p_0 e_0} & x^{p_0 e_1} & \ldots & x^{p_0 e_{\phi-1}} \\ x^{p_1 e_0} & x^{p_1 e_1} & \ldots & x^{p_1 e_{\phi-1}} \\ \vdots & \vdots & \ddots & \vdots \\ x^{p_{\phi-1} e_0} & x^{p_{\phi-1} e_1} & \ldots & x^{p_{\phi-1} e_{\phi-1}} \end{pmatrix}^{-1};$$

and computing, by circuitry of the decoding apparatus, the elements $a_{e_0}, \ldots, a_{e_{\phi-1}}$ of the vector a, as an output, by multiplying the vector b' and the inverse matrix $A'^{-1}$, the vector a corresponding to a plaintext input to the encoding apparatus.

6. A non-transitory computer readable medium including computer executable instructions that make a decoding apparatus, wherein x is an element of an irreducible polynomial f[X] that generates an extension field $GF(x^q)$, n and k are integers equal to or greater than 2, $n \geq 2k-1$, m denotes an integer equal to or greater than 1, $m = n-k$, vector a denotes a k-th order vector having elements $a_0, \ldots,$ $a_{k-1}$ ($a_0, \ldots, a_{k-1} \in GF(x^q)$), A denotes a n-by-k matrix defined by the following formula:

$$A_{ij} = \begin{cases} 1 & \text{if } i = j \\ 0 & \text{if } i \neq j \text{ and } i < k \\ x^{(i-k)j} & \text{if } i \geq k \end{cases}$$

where $i \in \{0, \ldots, n-1\}, j \in \{0, \ldots, k-1\}$, vector b denotes an n-th order vector having elements $b_0, \ldots, b_{n-1}$ ($b_0, \ldots, b_{n-1} \in GF(x^q)$) obtained by multiplying the vector a by the matrix A, φ denotes an integer equal to or greater than 1 and equal to or smaller than m, $d_0, \ldots, d_{k-\phi-1}$ denote different integers equal to or greater than 0 and smaller than k, $e_0, \ldots, e_{\phi-1}$ denote different integers equal to or greater than 0 and smaller than k that are different from $d_0, \ldots, d_{k-\phi-1}$, $p_0, \ldots, p_{\phi-1}$ denote different integers equal to or greater than k and smaller than n, perform a method comprising:

receiving the vector b as an input from an encoding anDaratus over a communications channel;

generating a φ-th order vector b' using φ elements $b_{p_0}, \ldots, b_{p_{\phi-1}}$ of the vector b, for $n = p_\phi$ according to the following formula:

$$b' = \begin{pmatrix} b'_0 \\ b'_1 \\ \vdots \\ b'_{\phi-1} \end{pmatrix} = \begin{pmatrix} b_{p_0} - \sum_{i<k-\phi} x^{p_0 d_i} b_{d_i} \\ b_{p_1} - \sum_{i<k-\phi} x^{p_1 d_i} b_{d_i} \\ \vdots \\ b_{p_{\phi-1}} - \sum_{i<k-\phi} x^{p_{\phi-1} d_i} b_{d_i} \end{pmatrix}$$

generating a φ-by-φ inverse matrix $A'^{-1}$ according to the following formula:

and $$A'^{-1} = \begin{pmatrix} x^{p_0 e_0} & x^{p_0 e_1} & \ldots & x^{p_0 e_{\phi-1}} \\ x^{p_1 e_0} & x^{p_1 e_1} & \ldots & x^{p_1 e_{\phi-1}} \\ \vdots & \vdots & \ddots & \vdots \\ x^{p_{\phi-1} e_0} & x^{p_{\phi-1} e_1} & \ldots & x^{p_{\phi-1} e_{\phi-1}} \end{pmatrix}^{-1};$$

computing the elements $a_{e_0}, \ldots, a_{e_{\phi-1}}$ of the vector a, as an output, by multiplying the vector b' and the inverse matrix $A'^{-1}$, the vector a corresponding to a plaintext input to the encoding apparatus.

7. The decoding apparatus according to claim 2, wherein $x=2$, and the circuitry is configured to perform an exclusive-OR operation as an addition and perform a bit shift operation as a polynomial multiplication.

8. The decoding apparatus according to claim 3, wherein $x=2$, and the circuitry is configured to perform an exclusive-OR operation as an addition and perform a bit shift operation as a polynomial multiplication.

* * * * *